United States Patent
Lenhard et al.

(10) Patent No.: US 6,713,999 B1
(45) Date of Patent: Mar. 30, 2004

(54) CURRENT SENSOR WORKING IN ACCORDANCE WITH THE COMPENSATION PRINCIPLE

(75) Inventors: Friedrich Lenhard, Hanau (DE); Stefan Schäfer, Rümmelsheim (DE); Paul Mourick, Fürth (DE)

(73) Assignees: Vacuumschmelze GmbH, Hanau (DE); Semikron Elektronik GmbH, Nuremberg (DE)

( * ) Notice: Subject to any disclaimer, the term of this patent is extended or adjusted under 35 U.S.C. 154(b) by 0 days.

(21) Appl. No.: 10/030,009

(22) PCT Filed: Apr. 15, 2000

(86) PCT No.: PCT/EP00/03444
§ 371 (c)(1),
(2), (4) Date: Feb. 15, 2002

(87) PCT Pub. No.: WO00/67040
PCT Pub. Date: Nov. 9, 2000

(30) Foreign Application Priority Data

Apr. 29, 1999  (DE) .......................................... 199 19 602

(51) Int. Cl.[7] ........................ G01R 15/18; G01R 19/00; H01F 27/42
(52) U.S. Cl. .................... 324/117 R; 323/356; 324/127
(58) Field of Search ............................. 324/117 R, 127, 324/126, 123 R; 323/355, 356, 357, 358

(56) References Cited

U.S. PATENT DOCUMENTS

| | | | | |
|---|---|---|---|---|
| 3,815,012 A | * | 6/1974 | Milkovic | ..................... 324/127 |
| 5,150,270 A | * | 9/1992 | Ernst et al. | ................... 323/357 |
| 6,078,172 A | | 6/2000 | Lenhard | ................. 324/117 R |
| 6,177,791 B1 | * | 1/2001 | Lenhard | ................. 324/117 R |
| 6,346,805 B1 | | 2/2002 | Ermisch et al. | ............. 324/127 |

FOREIGN PATENT DOCUMENTS

| | | |
|---|---|---|
| DE | 19618114 | 11/1997 |
| DE | 196 42 472 | 4/1998 |
| DE | 197 05 767 | 8/1998 |
| EP | 0 742 440 | 11/1996 |
| WO | WO 98/16839 | 4/1998 |

OTHER PUBLICATIONS

Suzuki, et al., "Analysis of a Zero–Flux type Current Sensor," *IEEE Transactions on Magnetics*, Bd. 29, Nr. 6 (Nov. 1, 1993).
International Search Report in PCT/EP00/03444.

* cited by examiner

*Primary Examiner*—Ernest Karlsen
(74) *Attorney, Agent, or Firm*—Dean W. Russell; Kilpatrick Stockton LLP

(57) ABSTRACT

A current sensor (1) is provided with low-pass filters (17 and 18) for stabilizing the pulse-duration modulated compensation signal. The current sensor is also provided with an additional RC element (40). Furthermore, a limiting means consisting of Zener diodes (44) and an ohmic resistance (45) is provided for suppressing fast current transients.

5 Claims, 4 Drawing Sheets

Figure 3:
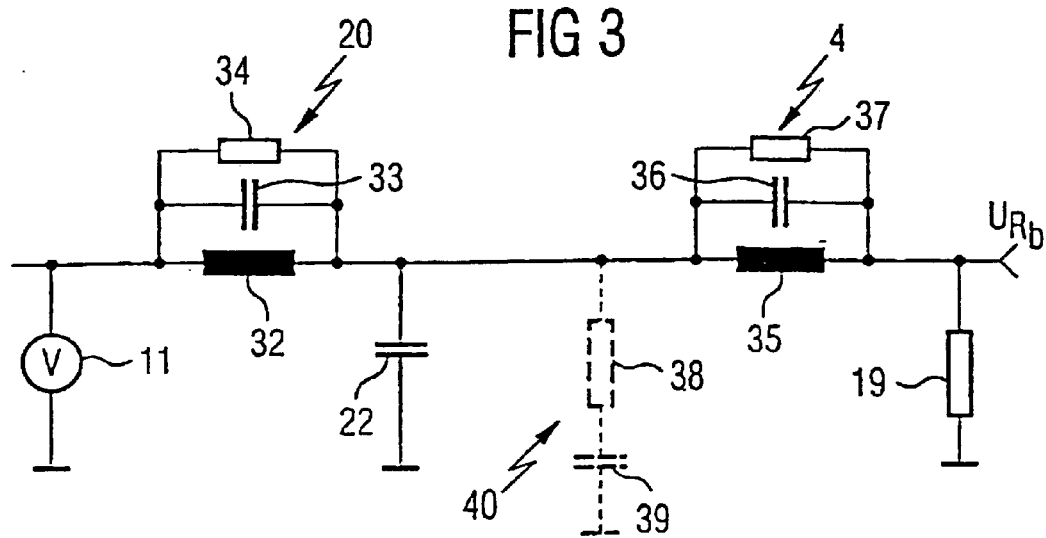

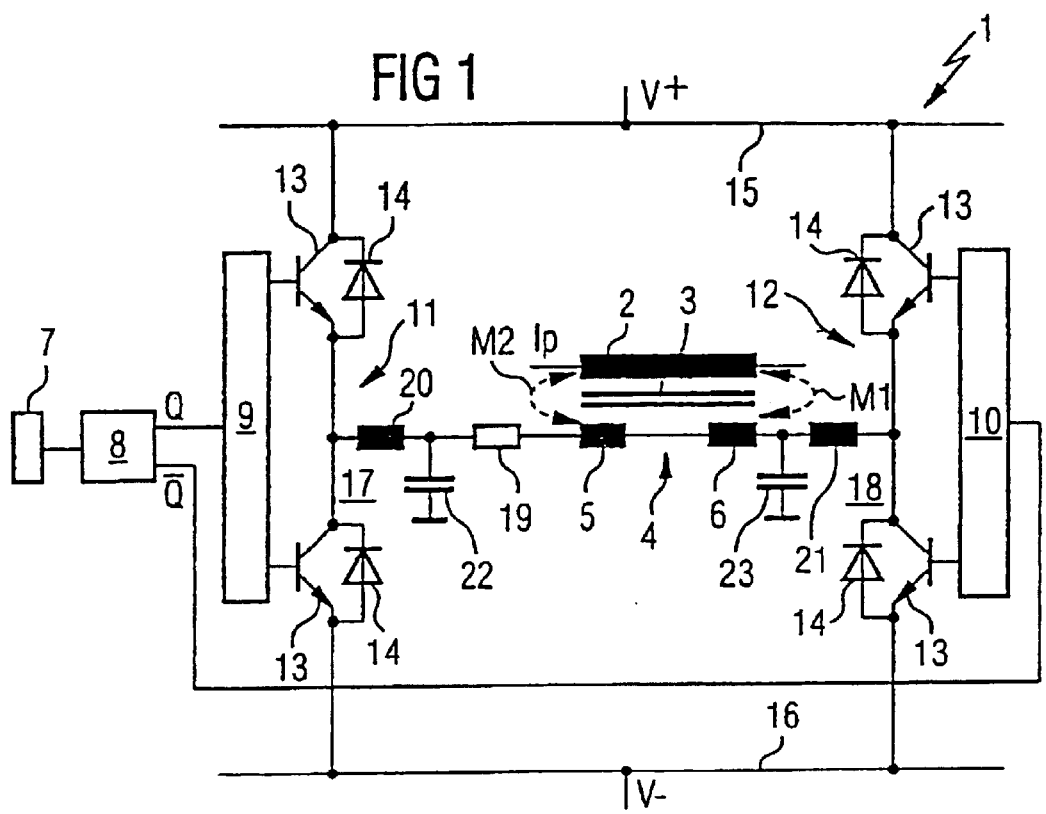
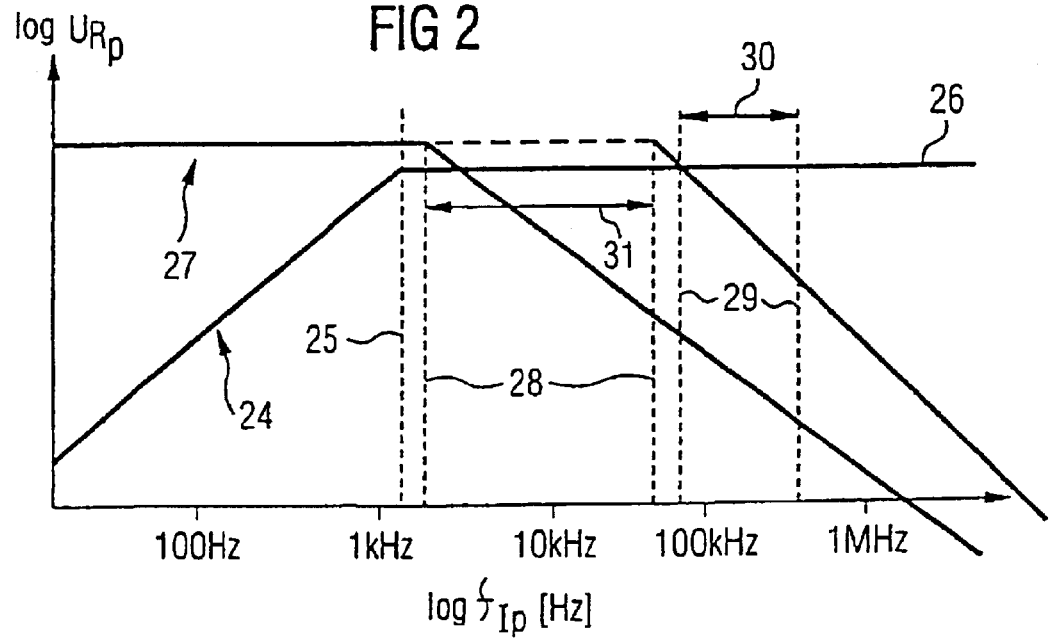

CURRENT SENSOR WORKING IN ACCORDANCE WITH THE COMPENSATION PRINCIPLE

This application claims priority to German Application No. 199 19 602.8 filed on Apr. 2, 1999 and International Application No. PCT/EP00/03444 filed on Apr. 15, 2000 and published in German as International Publication No. WO 00/67040 on Nov. 9, 2000, the entire contents of each are hereby incorporated by reference.

The invention relates to a current sensor working in accordance with the compensation principle with a primary winding through which the current to be measured flows, creating a magnetic field which can be compensated by compensation current flowing through a secondary winding, and by sensor means influenced by the magnetic field, which are down-streamed by a booster circuit, and which discharges the secondary winding connected in a series by a terminating resistor, with a pulse-duration modulated compensation signal.

Such a current sensor is known from DE-A-197 05 767. The known current sensor possesses a comparator, which is discharged at one comparator input with the measuring signal delivered by the sensor means, and on the other comparator input with a linear time base generated by a voltage generator. The comparator controls two reverse timing power amplifiers, between which the terminating resistor as well as the secondary winding is connected in a bridge circuit.

A current sensor is known from DE-OS-196 42 472, which uses a switchable booster for decreasing the power requirement for the compensation current, and for reducing the losses at an operation with excessive supply voltage, and which is controlled by a pulsing gating signal, which possesses a mark space ratio depending on the measured value.

EP-0 742 440 reveals a device for compensation current conversion, which uses a timed booster for the generation of the compensation current, which is connected in a series to a control amplifier. The pulse duration modulated timer is then carried from an oscillator at a firm frequency.

One of the disadvantages of the known current sensor is the fact that due to the frequency response of the booster circuit, only primary currents up to a certain upper frequency threshold can be measured. The current sensor can no longer follow the changes with frequencies of the primary current above the frequency threshold, so that the voltage does not drop via the terminating resistor, even though primary current is flowing through the primary winding.

Based on this state of technology, the task of the invention is to create a currency sensor, which can also be used at high primary current frequencies.

This task is solved by a current sensor in accordance with the disclosure herein.

The pulse-duration modulated compensation signal possesses timing frequencies above the converter frequency threshold. The frequency response of the booster circuit at the existing current to be measured ensures a measurable voltage drop via the terminating resistor. Furthermore, a low-pass filter arrangement for stabilizing the pulse-duration modulated compensation current is intended, which is down-streamed to the booster circuit, and contains inductances and capacitances, a filter frequency threshold below the resonance frequency of the converter, and below the timing frequency of the booster circuit, and which possesses excessive resonance, whereby the excessive resonance of the low-pass filter arrangement is damped by an RC element connected in parallel to the secondary winding and the terminating resistor.

The invention therefore uses the fact that the current sensor works as a current converter at high primary current frequencies. The energizing magnetic field is increasingly compensated at high primary current frequencies by the secondary currents flowing through the secondary winding caused by the reverse voltage. The secondary currents flowing through the secondary winding due to the converter behavior also result in a voltage drop at the terminating resistor. The voltage created at the terminating resistor due to the converter behavior gets stronger the higher the frequency of the primary current gets, in order to near the upper threshold value above the converter frequency threshold. In order for the current sensor relating to the invention to be usable independently of the primary current frequency, it must be ensured that no gap is formed in the frequency range between the converter behavior and the sensor behavior, in which the voltage at the terminating resistor drops substantially. This is achieved in particular by the timing frequencies of the pulse-duration modulated compensation signal being above the converter frequency threshold, and by the fact that the frequency response of the booster circuit, in particular that of the upper frequency threshold, also ensures a measurable voltage drop via the terminating resistor. Both measures combined ensure that a measurable voltage drop also occurs in a transition area between sensor behavior and converter behavior via the terminating resistor.

Additional beneficial designs and examples are subject to the attached claims.

Figure 4:
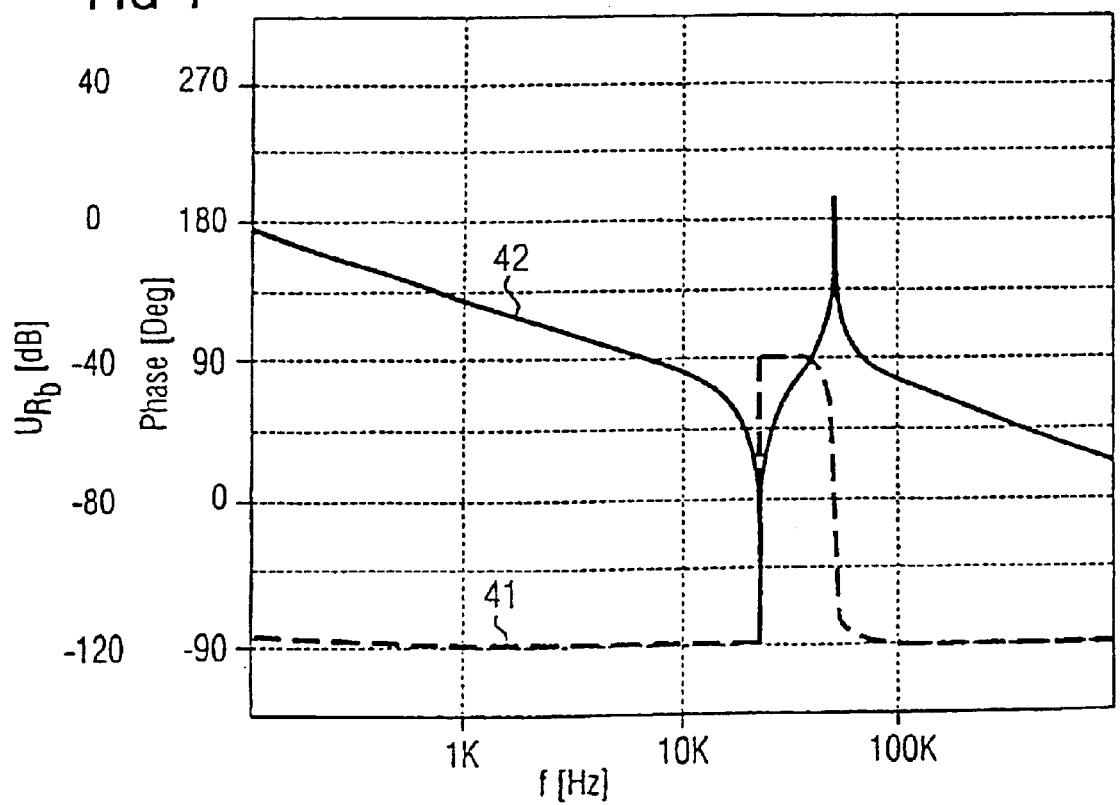
Figure 5:
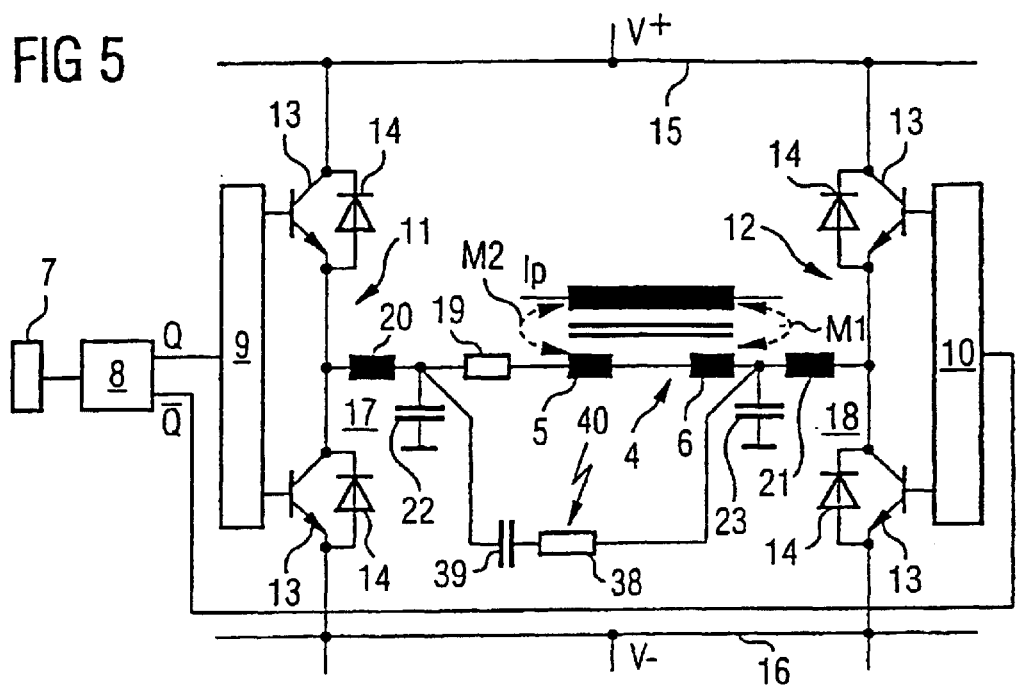
Figure 6:
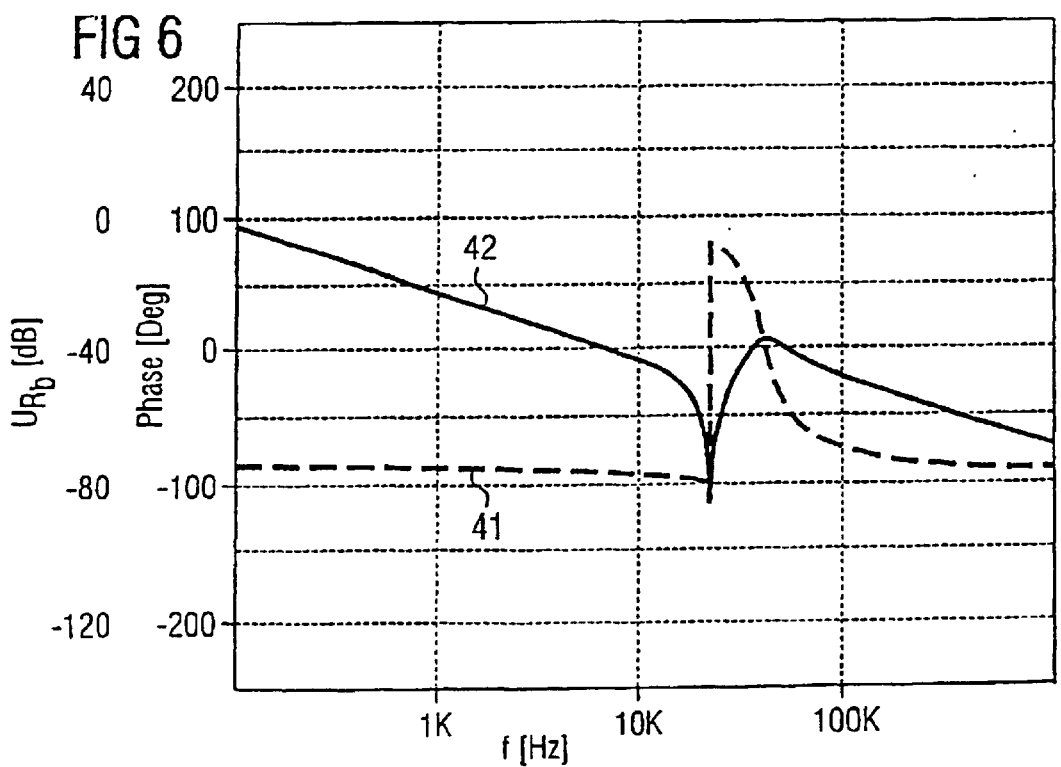
Figure 7:
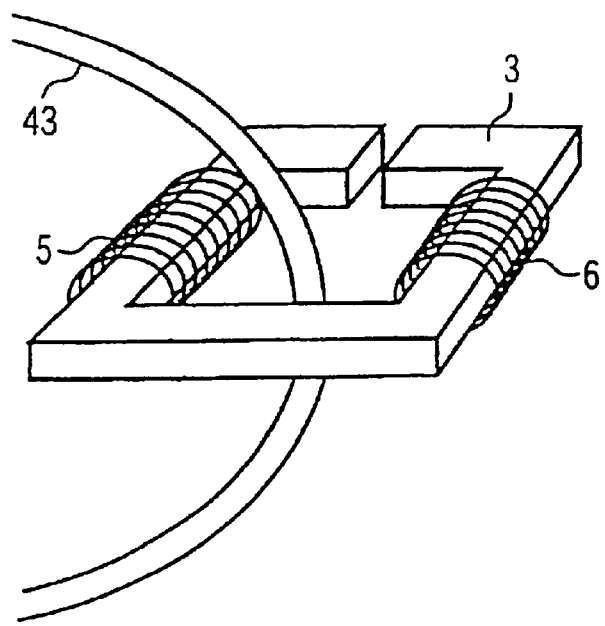
Figure 8:
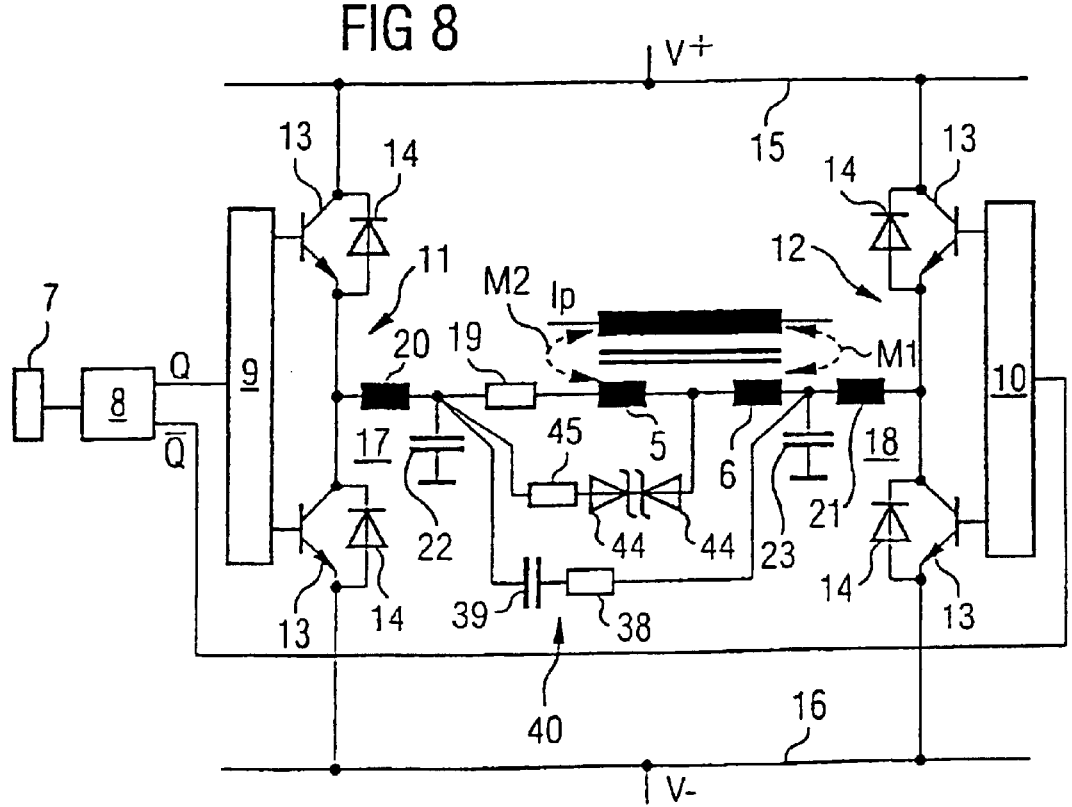

The following examples of the invention are explained in detail in the attached drawing. They show:

FIG. 1 the circuit of a current sensor with two reverse timing power amplifiers, between which a terminating resistor and the secondary winding are arranged a in a series with low-pass filters in a bridge circuit;

FIG. 2 a diagram, which shows the frequency threshold of the voltage dropping via the terminating resistor in dependency of the primary current frequency, FIG. 3 a substitute circuit diagram for the bridge circuit from FIG. 1;

FIG. 4 a diagram, illustrating the frequency threshold of the voltage amplitude and the phase at the substitute circuit diagram from FIG. 3;

FIG. 5 a circuit of a current sensor, at which the excessive resonance caused by the low-pass filter is damped by an RC element;

FIG. 6 a diagram illustrating the frequency threshold and the amplitude of the bridge circuit from FIG. 5;

FIG. 7 a schematic illustration showing the different feedback between the primary winding and the secondary coil; and FIG. 8 an additional current sensor, at which the excessive voltage between the secondary coils is limited via limiting means.

FIG. 1 shows a current sensor 1 with a primary winding 2, through which the primary current $I_p$ to be measured flows, both of which are coupled to two secondary coils 5 and 6 forming the secondary winding 4 via a magnetic core 3. The magnetic feedback between the primary winding 2 and the secondary coils 5 and 6 each is illustrated by the broken-lined arrows M1 and M2. The magnetic flow within the magnet core 3 is detected by a magnetic field sensor 7, which discharges a signal generator 8 for generating pulse-duration modulated booster signals Q and Q'. The booster signals Q and Q' are fed to the power amplifier circuits 9 and 10, each controlling transistors 13, forming two reverse timing power amplifiers 11 and 12. By converting the measuring signal of the magnetic field sensor 7 into the pulse-duration modulated compensation signals, any losses in the reverse timing power amplifiers 11 and 12 are minimized. The power transistors 13 are each bypassed by freewheeling diodes 14 and directly connected to the feed wires 15 and 16. Low-pass filters 17 and 18, a terminating resistor 19, and the secondary coils 5 and 6 are arranged in the bridge circuit between the reverse timing power amplifiers 11 and 12. The low-pass filters 17 and 18 each contain coils 20 and 21 with down-streamed condensers 22 and 23 connected to mass.

FIG. 2 explains the functions of the current sensor 1.

FIG. 2 illustrates the frequency response of different voltage components dropping at the terminating resistor 19 depending on the frequency of the primary current $I_p$. A converter characteristic curve 24 represents the frequency dependency of that voltage component, which drops at the terminating resistor 19 due to the converter behavior of the current sensor 1. As the energized magnetic field is increasingly compensated by the secondary current flowing through the secondary coils 5 and 6 induced by a reverse voltage at increasing frequency of the primary current I, the voltage increasing at the terminating resistor 19 drops with increasing frequency. Due to the compensation of the magnetic flow of the current in the secondary coils 5 and 6, which increases with increasing frequency, the voltage component caused by the converter behavior finally reaches a maximum voltage 26 above a converter frequency 25.

The sensor characteristic curve 27 in FIG. 2 illustrates the frequency dependency of that voltage component dropping at the terminating resistor 19, which is caused by the sensor behavior of the current sensor 1. This voltage component is essentially consistent up to a certain sensor frequency threshold 28, in order to then drop above the sensor frequency threshold 28 in the booster circuit, which is caused by the frequency threshold formed by the signal generator 8, timing power amplifiers 9 and 10 and the reverse timing power amplifiers 11 and 12. In order to ensure a voltage drop at each frequency of the primary current $I_p$ at the terminating resistor 19, it is necessary to avoid any gaps in the transition area between the converter behavior and the sensor behavior. For this reason, the timing frequencies 29 of the pulse-duration modulated compensation signals Q and Q' should be above the converter frequency threshold 25, if possible. One possible area of timing frequencies 29 is illustrated in FIG. 2 by an arrow 30. The sensor frequency threshold 28 should also preferably be above the converter frequency threshold 25. However, if an interruption of the measuring voltage dropping at the terminating resistor 19 is calculated in, the sensor frequency threshold 28 may also be below the converter frequency threshold 25. It must be ensured, however, that the sensor frequency threshold 28 is not so low that the measuring voltage at the terminating resistor 19 interrupts so strongly that a gap is formed in the frequency response of the measuring voltage between the converter behavior and the sensor behavior.

The measuring voltage dropping at the terminating resistor 19 is usually measured with the aid of a differential amplifier connected to both ends of the terminating resistor 19. When the frequency response of the booster circuit, which consists of the signal generator 8, the power amplifier circuits 9 and 10 as well as the reverse timing power amplifiers 11 and 12, shows a sensor frequency threshold 28 above the timing frequencies 29, and the low-pass filters 17 and 18 are not available, a common mode voltage common with the voltage differential of the supply voltages and a frequency common to the timing frequency 29 is contiguous to the inputs of the differential amplifier via the terminating resistor 19. Typically, the differential amplifier would then be loaded via a common-mode voltage of +/−15 volts at a frequency of 400 kHz via the terminating resistor 19. The common-mode suppression of common operating amplifiers is usually unable to withstand such a common-mode load.

It is therefore beneficial to place the sensor frequency threshold 28 to values below the timing frequency 29. This results in preferred areas for the sensor frequency threshold 28 as illustrated in FIG. 2 by the arrow 31.

The sensor frequency threshold 28, for instance, can effectively be moved in small increments by the low-pass filters 17 and 18 as illustrated in FIG. 1. According to FIG. 1, this is done in the circuit by the low-pass filters 17 and 18 with the coils 20 and 21 as well as the condensers 22 and 23. Typical values for the inductance of the coils 20 and 21, and for the capacities of the condensers 22 and 23 are 68 to 100 $\mu$H and 100 nF. One disadvantage of the circuit from FIG. 1 is that the low-pass filters 17 and 18 used contain a non-salient phase displacement. This can cause an undesirable regenerative feedback across the circuit magnetic field sensor 7, signal generator 8, timing power amplifier circuit 9 and 10, reverse timing power amplifiers 11 and 12, secondary winding 4, magnetic field sensor 7, whereby the circuit can oscillate freely at a frequency corresponding to the resonance frequency of the low-pass filters 17 and 18.

These facts are explained in detail in FIGS. 3 and 4.

FIG. 3 shows a substitute circuit diagram for the bridge circuit formed from the low-pass filters 17 and 18, the terminating resistor 19, and the secondary winding 4. The coil 20 of the low-pass filter 17 is illustrated by a filter inductance 32, a filter capacity 33, and a filter resistor 34. Accordingly, the secondary winding 4 is illustrated by a winding inductance 35, a winding capacitance 36, and a winding resistor 37. FIG. 3 also shows an RC element 40, illustrated by a broken line, formed by a resistor 38 and a capacity 39, which will be explained in details in another paragraph.

FIG. 4 shows the task of the phase 41 and the voltage amplitude 42 of the measuring voltage $U_{Rb}$ via the terminating resistor 19 in dependency of the frequency. The first phase jump by +180° is created by the winding capacitance 36 in combination with the winding inductance 35, and is of secondary meaning. The second phase jump by −180° is effected by the low-pass filter 17 and creates an excess of amplitude on the resonance frequency, on which the current sensor 1 can oscillate.

The following values were used for the simulation:

The filter inductance 32, the filter capacitance 33, and the filter resistor 34 were each set to the values 220 $\mu$H, 10 pF and 0.5 ohm. Finally, the values 1 H, 50 pF, and 40 ohm were selected for the winding inductance 35, the winding capacitance 36, and the winding resistor 37.

FIG. 5 shows how the excessive resonance was damped at the second phase jump by the RC element 40, shown as a broken line in FIG. 3. Typical values for the resistor 38, and the capacitance 39 are 65 ohm, and 200 nF. As FIG. 6 shows, the additional RC element 40 reduces the resonance quality, and thereby also reduces the excessive amplitude at the second phase jump, so that the 0 dB line is no longer achieved. Therefore, oscillations no longer occur in this case.

In an alternate, not illustrated example, the reduction of the excessive resonance is If effected by a resistor, which is connected in parallel to a low-pass filter 17 and 18. This resistor connected in parallel can also stabilize the current sensor 1. However, the filter characteristics of the low-pass filters 17 and 18 would have to be reduced for this purpose.

Another problem with regard to high frequencies of the primary current $I_p$ is the possibility of fast transients of the primary current $I_p$. This is of particular meaning when the secondary winding 4 is arranged, for instance, into both secondary coils 5 and 6. Typically, the magnetic feedback between the primary winding 2 and the secondary coils 5 and 6 differs due to the mechanical construction of the current sensor 1, and the arrangement of the primary winding 2 with regard to the secondary coils 5 and 6. FIG. 7 shows such a case. In this case, the primary winding 2 is a wire-like conductor 43, which is fed through the inner orifice of the ring-like magnetic core 3 in an arc. In the case illustrated in FIG. 7, the wire-like conductor 43 provides better feedback to the secondary coil 5 than to the secondary coil 6.

This results in the occurrence of an extremely high voltage at a very fast transient of the primary current $I_p$, i.e., at a large $dI_p/dt$ at the center point between both secondary coils 5 and 6. This is due to the fact that different secondary currents are energized in the secondary coils 5 and 6 by the varying magnetic feedback M1 and M2 during the current increase. Because the secondary coil 5 and the secondary coil 6 are connected in a series, different secondary currents are possible only if excessive voltage is generated at the connection between both secondary coils 5 and 6. This excessive voltage can easily reach several kilovolts, and leads to at least a breakdown of the winding insulation of the secondary coils 5 and 6. It is therefore important to limit these excessive voltages.

Limitation of excessive voltage is done in the example illustrated in FIG. 8 by a few Zener diodes 44, which are connected in a series, and polarized in reverse order, which, together with an ohmic resistance 45, are connected in a series to the terminating resistor 19 and to the secondary coil 6. Typically, the breakdown voltage of the Zener diode 44 is at 390 v. In order for the limiting circuit not to become effective at a low $dI_p/dt$, it is beneficial if rather high breakdown voltages of the Zener diodes 44 are selected. Additional currents flow through this limitation circuit at excessive voltages via the terminating resistor 19. The measuring result at the terminating resistor 19 is slightly affected by this. However, this only occurs at high $dI_p/dt$ of, for instance, over 100 A/μs. Generally, however, such fast transients only occur with short circuit currents. In these cases, however, no high accuracy in the measurement of the primary current $I_p$ is necessary.

The ohmic resistance 45 limits the excessive voltage less harshly. The duration of the excessive voltage is limited at an ohmic resistance value of 1 kohm to 10 μs.

The limiting circuit is suitably applied across that of the two secondary coils 5 and 6, which provides the most feedback to the primary winding 2. However, it is also possible to include another corresponding limiting circuit across the secondary coil 6 in addition to the limiting circuit illustrated in FIG. 8. In the same way, it is possible not to connect the resistor 45 to the low-pass filter 17, but rather to the mass. However, in this solution the limiting currents do not flow across the limiting resistor 19, and can therefore not be detected.

Finally it should be noted that the principles and measures illustrated herein also apply to current sensors with only one booster power amplifier. It is possible, for instance, to omit the reverse timing power amplifier 11 as well as the low-pass filter 17 in the examples illustrated in FIGS. 1, 5, and 8, and to connect one end of the, terminating resistor 19 to the mass.

What is claimed is:

1. A current sensor having an output and comprising:

a primary winding through which the current to be measured flows, creating a magnetic field, a secondary winding, through which compensation current flows, which generates a magnetic field compensating the primary winding, whereby the primary winding and the secondary winding combined form a converter with a certain resonance frequency, a terminating resistor connected in series to the secondary winding, sensor means, which are exposed to the resulting magnetic field of the primary and secondary windings.

a booster circuit, which is closer to the output than the sensor means, and which feeds the compensation current to the secondary winding via the terminating resistor, whereby the compensation current is pulse-duration modulated with a timing frequency above the resonance frequency of the converter, and a low-pass filter arrangement for stabilizing the pulse-duration modulated compensation current, which is closer to the output than the booster circuit, comprising inductances and capacitances, which possesses a filter frequency threshold below the resonance frequency of the convener and below the timing frequency of the booster circuit, as well as excessive resonance, whereby the excessive resonance of the low-pass filter arrangement is damped by an RC element connected in parallel to the secondary winding and the terminating resistor.

2. The current sensor in accordance with claim 1, wherein the secondary winding is divided into a multitude of secondary coils, whereby the excessive voltages occurring between the secondary coils is limited by limiting means.

3. The current sensor in accordance with claim 2, wherein the limiting means are Zener diodes, which are connected in a series, polarized in reverse order, and which are connected in parallel to the secondary coils.

4. The current sensor in accordance with claim 1, wherein the booster circuit has at least one reverse timing power amplifier.

5. The current sensor in accordance with claim 4, wherein the terminating resistor and the secondary winding are connected via a bridge circuit between reverse timing power amplifiers.

* * * * *